US006801556B2

United States Patent
Fischer

(10) Patent No.: US 6,801,556 B2
(45) Date of Patent: Oct. 5, 2004

(54) OPTICAL SOURCE DRIVER WITH OUTPUT LOAD DETECTION CIRCUIT

(75) Inventor: Jonathan H. Fischer, Longmont, CO (US)

(73) Assignee: Agere Systems Inc., Allentown, PA (US)

( * ) Notice: Subject to any disclaimer, the term of this patent is extended or adjusted under 35 U.S.C. 154(b) by 1 day.

(21) Appl. No.: 10/039,321

(22) Filed: Nov. 9, 2001

(65) Prior Publication Data

US 2003/0091077 A1 May 15, 2003

(51) Int. Cl.$^7$ ................................................. H01S 3/00
(52) U.S. Cl. ..................... 372/38.02; 372/31; 372/29; 372/38; 372/25
(58) Field of Search ...................... 372/38, 38.02, 372/31, 29, 38.01

(56) References Cited

U.S. PATENT DOCUMENTS

| | | | | | |
|---|---|---|---|---|---|
| 5,883,910 A | * | 3/1999 | Link | ........................ | 372/38.07 |
| 5,970,026 A | * | 10/1999 | Wachi et al. | ............. | 369/13.22 |
| 6,044,095 A | * | 3/2000 | Asano et al. | .................. | 372/31 |
| 6,266,078 B1 | * | 7/2001 | Koga et al. | .................. | 347/236 |
| 6,362,910 B1 | * | 3/2002 | Tokita | .......................... | 398/183 |
| 6,445,474 B1 | * | 9/2002 | Dubos et al. | ................ | 398/141 |
| 6,465,967 B2 | * | 10/2002 | Tsujikawa et al. | ........ | 315/169.1 |
| 6,466,595 B2 | * | 10/2002 | Asano | ..................... | 372/29.021 |
| 6,560,256 B1 | * | 5/2003 | Seki et al. | ................ | 372/38.02 |

* cited by examiner

*Primary Examiner*—Don Wong
*Assistant Examiner*—Dung Nguyen

(57) ABSTRACT

A driver circuit for a laser diode or other optical source includes an input stage, an output stage, a current generator circuit and an output load detection circuit. The current generator circuit is adapted to establish a modulation current for application to one of a first output and a second output of the output stage in accordance with a differential or single-ended input data signal applied to the input stage. The output load detection circuit has first and second inputs coupled to the respective first and second outputs of the output stage, and is configured to detect an improper load condition at one or more of the first and second outputs of the output stage and to generate a corresponding output indicator. The output indicator is utilized in the driver circuit to control the modulation current so as to prevent saturation of the output stage in the presence of the improper load condition. For example, the output load detection circuit may be configured to determine if a voltage level of at least one of the first and second outputs of the output stage drops below a designated load detection sense threshold, in which case the modulation current can be disabled or otherwise interrupted so as to prevent the saturation of the output stage.

17 Claims, 4 Drawing Sheets

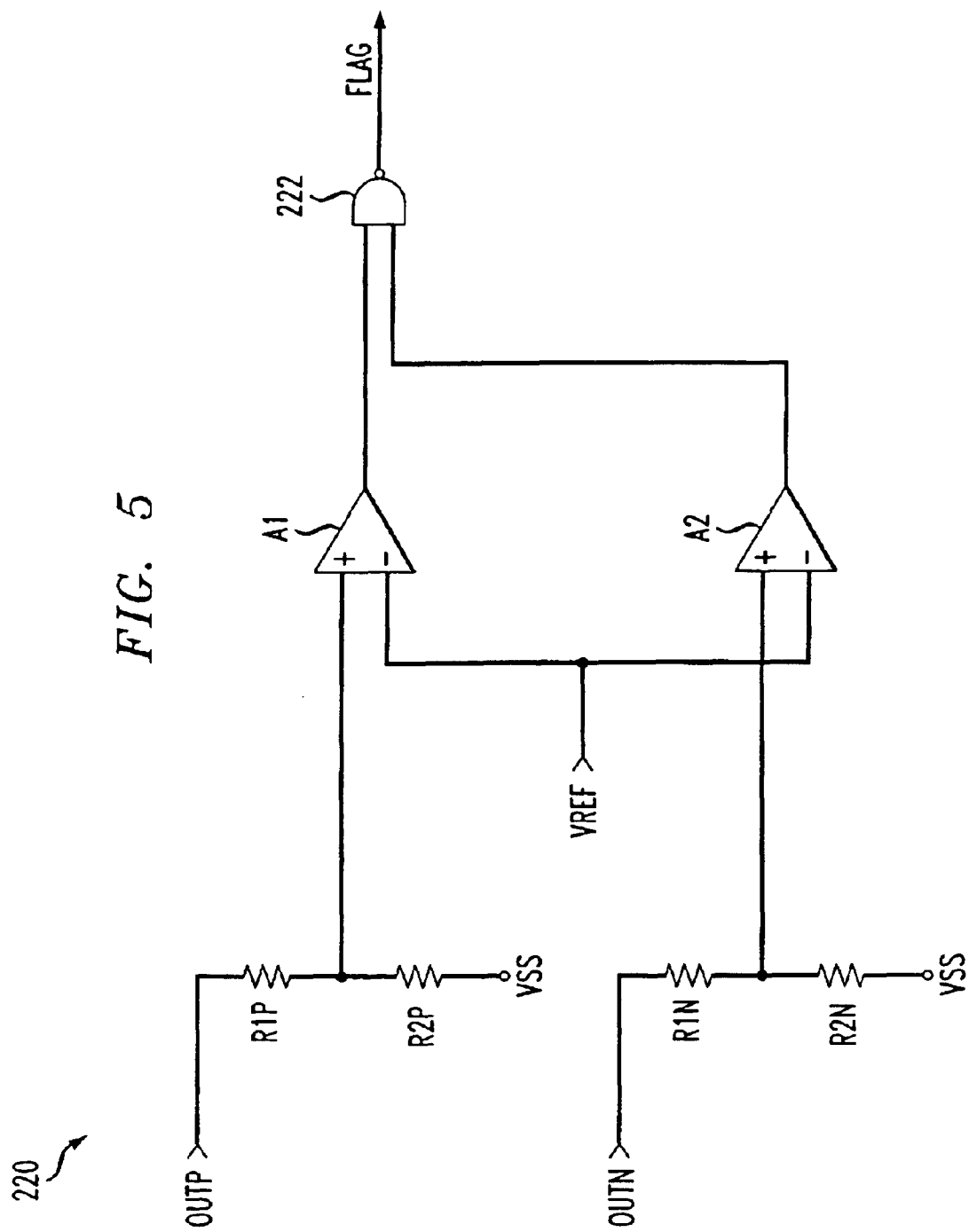

OPTICAL SOURCE DRIVER WITH OUTPUT LOAD DETECTION CIRCUIT

RELATED APPLICATION

The present invention is related to the invention described in U.S. patent application Ser. No. 09/949,592, filed Sep. 10, 2001 in the name of inventor J. H. Fischer and entitled "Optical Source Driver with Bias Circuit for Controlling Output Overshoot," which is incorporated by reference herein.

FIELD OF THE INVENTION

The present invention relates generally to circuits for supplying drive current to lasers or other optical sources, and more particularly to load detection circuits for use in an output stage of a laser driver or other optical source driver.

BACKGROUND OF THE INVENTION

Laser diodes and other types of semiconductor lasers are in widespread use as optical sources in high-speed optical data transmission applications. Laser diodes are particularly desirable in such applications due to their high optical output power and spectral purity. A laser driver circuit, also referred to herein as simply a "driver," is used to supply appropriate drive current to a semiconductor laser, so as to control the optical output signal between an "on" state corresponding to a logic one level and an "off" state corresponding to a logic zero level, in accordance with the data to be transmitted.

Conventional semiconductor laser driver circuits are described in U.S. Pat. No. 5,883,910, issued Mar. 16, 1999 in the name of inventor G. N. Link and entitled "High Speed Semiconductor Laser Driver Circuits," which is incorporated by reference herein.

A significant problem with conventional semiconductor laser driver circuits such as those described in the above-cited U.S. Pat. No. 5,883,910 is that such circuits can be damaged as a result of output stage saturation. For example, in the process of manufacturing optical systems that use laser drivers, components may be inadvertently left off a laser driver circuit board during assembly. Such a condition is usually discovered only when testing the laser driver board after assembly. However, at this stage in the process, a missing component can result in an undesirable saturation of the laser driver output stage. The saturation of the laser driver output stage can destroy the laser driver on the spot, or may simply damage it such that the driver will be susceptible to failure in the field. Another scenario that can lead to the saturation of the laser driver output stage is the use of a faulty load board connection. Such load boards are commonly used in factory testing of a laser driver, prior to shipment of the driver to a customer, and saturation resulting from an improper connection on a load board can cause the driver output stage to be damaged or destroyed.

Previous attempts to address the output stage saturation problem described above include limiting the output stage fault current by adding a current limiting resistor in the base circuit of one or more output stage transistors. Unfortunately, adding a resistance large enough to provide the desired protection can significantly limit the maximum operating speed of the driver, and may also cause other portions of the output stage circuitry to enter saturation in the presence of the fault condition. Another possible approach is to increase the size of the collector and emitter of one or more of the output stage transistors, so as to accommodate the substantially higher current loads associated with the fault condition. However, the additional parasitic capacitances associated with this "brute force" approach will prevent proper operation at high speeds, e.g., operating speeds on the order of 2.5 Gbits per second or more.

A need therefore exists for improved driver circuits, for use with semiconductor lasers and a, other optical sources, which are configured to prevent the above-described output stage saturation problem without limiting the operating speed of the driver circuit.

SUMMARY OF THE INVENTION

The invention provides improved optical source driver circuits which meet the above-noted need.

In accordance with one aspect of the invention, a driver circuit for a laser diode or other optical source includes an input stage, an output stage, a current generator circuit and an output load detection circuit. The current generator circuit is adapted to establish a modulation current for application to one of a first output and a second output of the output stage in accordance with a differential or single-ended input data signal applied to the input stage. The output load detection circuit has first and second inputs coupled to the respective first and second outputs of the output stage, and is configured to detect an improper load condition at one or more of the first and second outputs of the output stage and to generate a corresponding output indicator. The output indicator is utilized in the driver circuit to control the modulation current so as to prevent saturation of the output stage in the presence of the improper load condition. For example, the output load detection circuit may be configured to determine if a voltage level of at least one of the first and second outputs of the output stage drops below a designated load detection sense threshold, in which case the modulation current can be disabled or otherwise interrupted so as to prevent the saturation of the output stage.

Advantageously, the invention can prevent undesirable saturation of the output stage of a laser driver under fault conditions, while also maintaining the ability of the laser driver to operate at high speeds.

BRIEF DESCRIPTION OF THE DRAWINGS

FIG. 5 is a schematic diagram of an output load detection circuit of the FIG. 3 laser driver circuit configured in accordance with the illustrative embodiment of the invention.

DETAILED DESCRIPTION OF THE INVENTION

The present invention will be illustrated herein using exemplary semiconductor laser driver circuits. It should be understood, however, that the particular circuits shown are by way of illustrative example only, and the techniques of the invention are more generally applicable to a wide variety of other optical source drivers. Moreover, although illustrated using a laser diode optical source, the invention can of course be utilized with other types of optical sources.

The general operating characteristics of an illustrative embodiment of the invention will initially be described with reference to the simplified diagrams of FIGS. 1 and 2. More detailed schematic diagrams showing an example laser driver and the particular type of output load detection utilized in the illustrative embodiment will be described in conjunction with FIGS. 3, 4 and 5.

Figure 1:
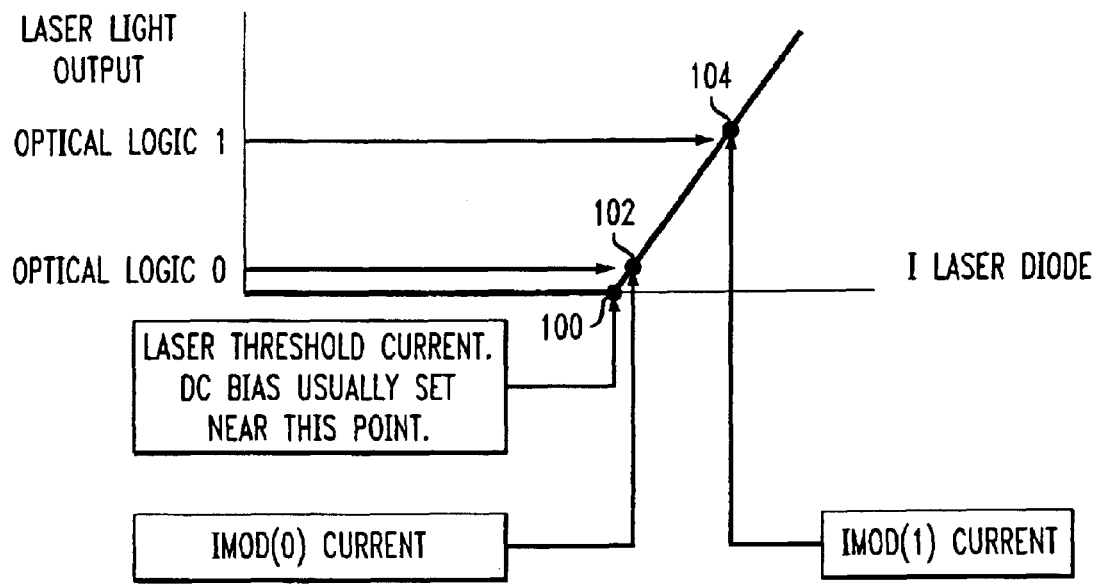
FIG. 1 is a plot of laser diode output as a function of drive current in an illustrative embodiment of the invention.

FIG. 1 shows laser diode light output as a function of diode current in an illustrative embodiment of the invention. Point 100 on the plotted output characteristic corresponds to the laser threshold current. This is the point at which further increases in current will generate laser light output. It is generally desirable in high-speed optical data transmission applications for the direct current (DC) bias of the laser diode to be set at or near this point. Points 102 and 104 on the plotted characteristic correspond to respective low and high modulation current levels IMOD(0) and IMOD(1). These current levels are associated with generation of an optical logic zero output and an optical logic one output, respectively. It is assumed for simplicity and clarity of description that a high level optical output is a logic one and a low level optical output is a logic zero, although it is to be appreciated that this is not a requirement of the invention.

It should also be noted that the particular output characteristic as shown in FIG. 1 is illustrative only, and the invention can be used with optical sources having other types of output characteristics.

Figure 2:
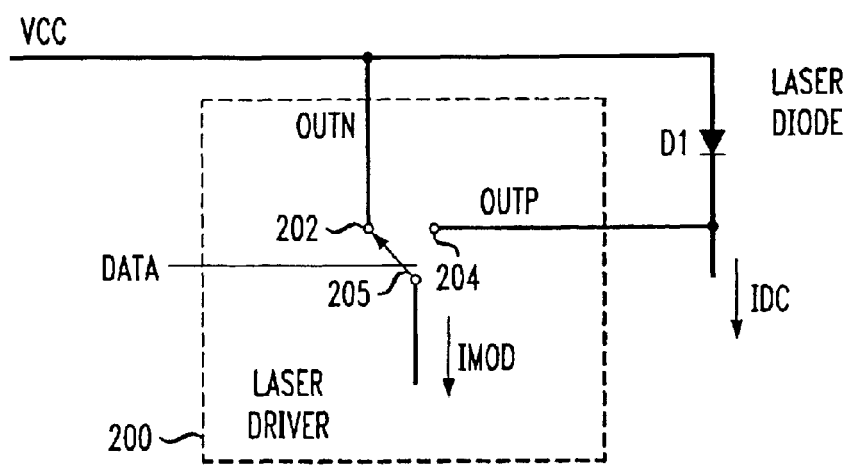
FIG. 2 shows a simplified diagram of a laser diode optical source and an associated laser driver circuit in which the present invention is implemented.

FIG. 2 shows a portion of an optical system transmitter in accordance with the invention. The portion of the transmitter as shown includes a laser driver circuit 200 and a laser diode D1. A DC bias current IDC is applied to the laser diode D1 as indicated by an associated DC bias circuit (not shown). As indicated previously, the DC bias current IDC is used to bias the laser diode D1 up to an appropriate threshold, such that the modulation circuitry need only drive enough current to switch the laser diode between the logic low output level and the logic high output level.

The laser driver circuit 200 includes a data input and negative and positive outputs denoted OUTN (terminal 202) and OUTP (terminal 204), respectively. The applied data in this simplified diagram serves to control the position of switch 205 such that the low modulation current IMOD(0) is applied to the laser diode D1 when the data is at a logic low level, and the high modulation current IMOD(1) is applied to the laser diode D1 when the data is at a logic high level. This occurs through direction of the modulation current IMOD via switch 205 and the OUTN terminal 202 to supply voltage VCC when the input data is at a logic low level, and via switch 205 and the OUTP terminal 204 to the anode of laser diode D1 when the input data is at a logic high level.

The description herein assumes that the IMOD(0) and IMOD(1) levels as shown in FIG. 1 are normalized to the applied DC bias current, such that when IMOD(0) or IMOD (1) is indicated as being applied to the laser diode D1, the total applied current is the sum of the DC bias current IDC and the particular modulation current IMOD(0) or IMOD (1). It should be noted that the IMOD(0) current maybe zero, i.e., points 100 and 102 in FIG. 1 may be the same, such that the applied current in this case is only the DC bias current IDC.

The laser driver 200 is particularly well-suited for use in an optical system that includes multiple laser driver modules, each supplying drive current for a corresponding laser diode. In such an application, there may be significant advantages in minimizing the overall system power in order to allow higher integration. One possible technique is to configure a given laser driver module so as to drive the corresponding laser diode with just enough current to meet the system optical power specification. When the laser diode is new, little current is needed to meet this specification. However, as the laser diode ages, more current is needed. To handle expected production variation and laser diode aging, the above-described modulation current (IMOD) may be specified, e.g., over a 12:1 range (such as 5 mA to 60 mA). The system may also require a particular ratio of the "on" state current (Ion) to "off" state current (Ioff) for the laser diode, e.g., an Ion:Ioff ratio of 10:1 or greater. With reference to FIG. 1, the laser diode D1 is considered to be in the on state upon application of the high modulation current IMOD(1) and in the off state upon application of the low modulation current IMOD(0).

Figure 3:
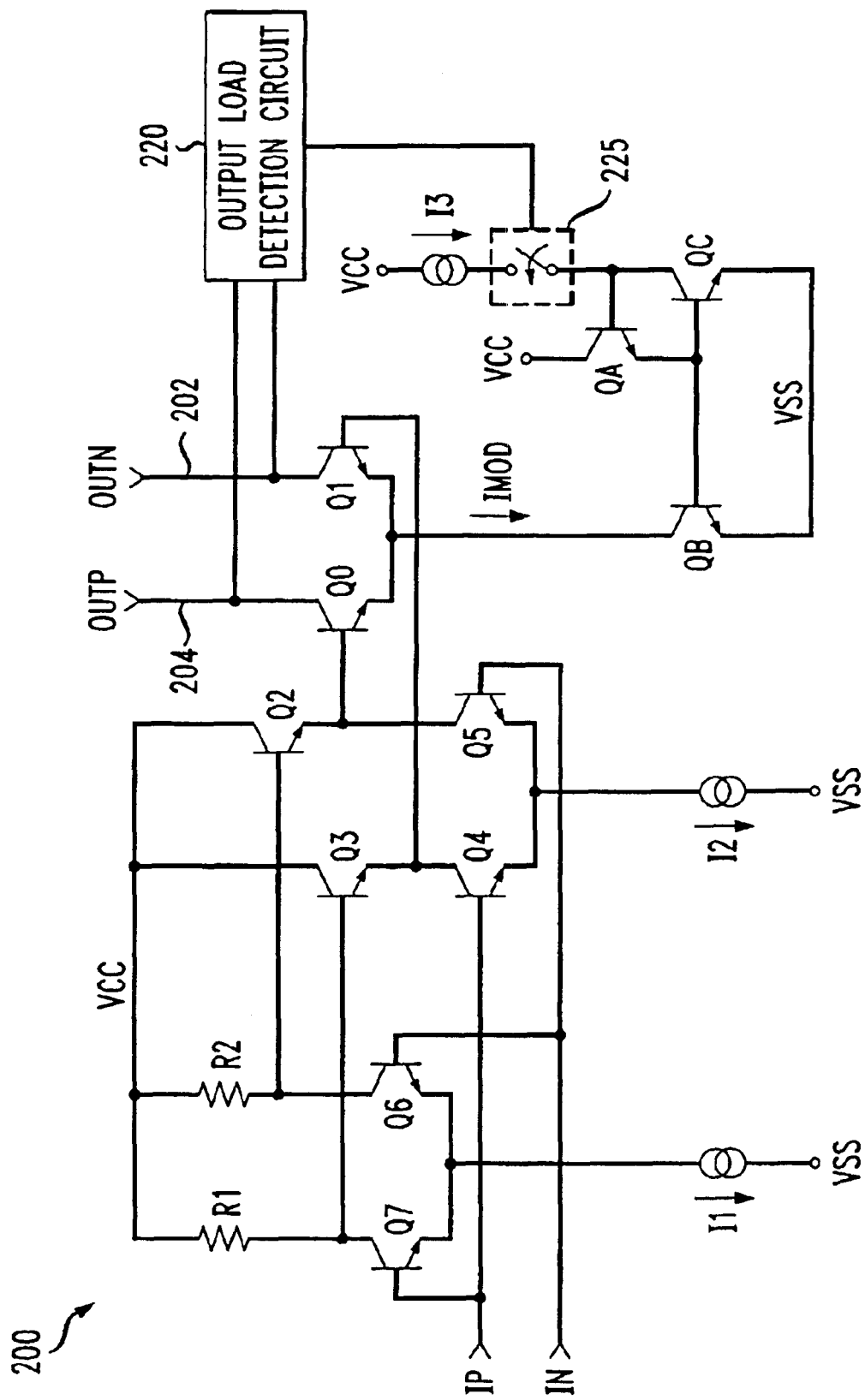
FIG. 3 is a schematic diagram of the laser driver of FIG. 2.

FIG. 3 shows a more detailed view of one possible implementation of the laser driver 200 of FIG. 2 in accordance with the invention. The laser driver 200 as shown includes an output stage differential pair comprising transistors Q0 and Q1, a push-pull stage comprising transistors Q2 through Q5, and an input stage differential pair comprising transistors Q6 and Q7. The top half (Q2, Q3) of the push-pull stage (Q2—Q5) drives the output stage differential pair (Q0, Q1), while the bottom half (Q4, Q5) of the push-pull stage is driven directly by differential data inputs IP and IN. The differential data inputs also drive the input stage differential pair (Q6, Q7). The output stage differential pair corresponds generally to switch 205 of FIG. 2.

The laser driver 200 further comprises current sources I1, I2 and I3, and an output load detection circuit 220.

The current sources I1 and I2 provide bias current for the input stage differential pair and the push-pull stage differential pair, respectively. The current source I3 is arranged in a current generator circuit comprising transistors QA, QB and QC as shown. This current generator circuit generates the above-noted IMOD current, which as previously indicated may be in a range from about 5 mA to 60 mA. Techniques for generating the IMOD current and other currents associated with the laser driver 200, in a manner that reduces output overshoot of the laser driver, are described in the above-cited U.S. patent application Ser. No. 09/949,592.

The modulation current IMOD is applied via one of the transistors Q0 or Q1 of the output stage differential pair to respective output terminal OUTP 204 or OUTN 202, in accordance with the differential data inputs.

The current sources I1, I2 and I3, and other current sources or generators referred to herein, may be configured in a straightforward manner using well-known conventional techniques, as will be apparent to those skilled in the art. For example, such sources or generators can be configured using appropriately-sized metal-oxide-semiconductor (MOS) devices, as will be readily appreciated by those skilled in the art.

The term "current generator circuit" as used herein is intended to include a single current source or other circuit which generates each of the above-noted currents, as well as portions or combinations of multiple circuits each of which generates a particular one of the currents.

The differential data applied to the input terminals IP and IN may comprise, e.g., approximately 200 to 300 mV peak differential logic signals, such that the differential pairs Q6, Q7 and Q4, Q5 each switch their corresponding bias current to one side of the pair or the other.

The FIG. 3 circuit further includes resistors R1 and R2 coupled between respective collector terminals of the input differential pair transistors Q7 and Q6 and the supply voltage VCC. The resistors R1 and R2 may be configured as 220 ohm resistors, although other values could also be used.

Additional details regarding the differential pairs and other circuitry of the laser driver 200 can be found in, e.g., A. B. Grebene, "Bipolar and CMOS Analog Integrated Circuit Design," John Wiley & Sons, 1984, ISBN 0-471-08529-4, which is incorporated by reference herein.

The present invention in the illustrative embodiment utilizes the output load detection circuit 220 to alleviate the previously-described output stage saturation problem in the laser driver 200.

Figure 4:
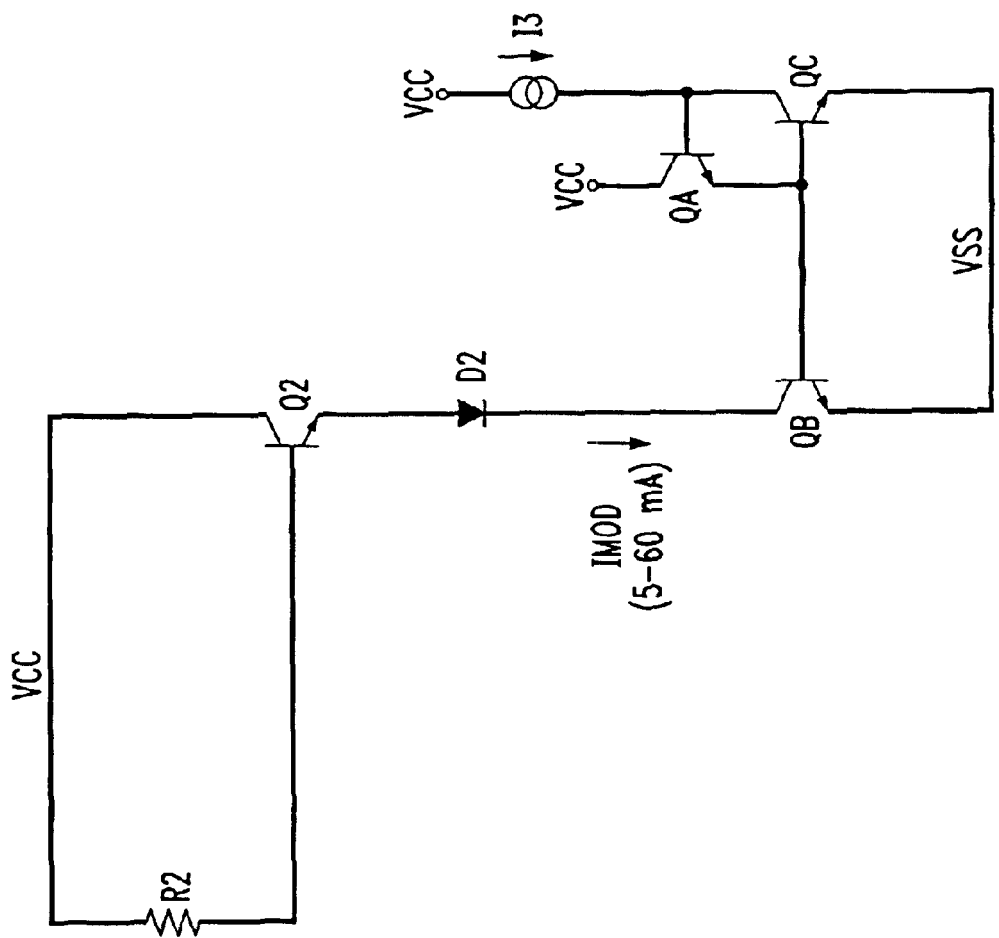
FIG. 4 illustrates the output stage of the FIG. 3 laser driver under a fault condition.

FIG. 4 illustrates one possible fault condition that can arise in laser driver 200 of FIG. 3 when the output load detection circuit 220 is not utilized. It is assumed for this example that the fault condition is that the laser diode D1 is either defective or has been inadvertently left off a corresponding circuit board, such that D1 is modeled as an open circuit. A similar condition will result if an improper connection on a load board is used in testing the laser driver. The figure shows a simplified view of the laser driver output stage when the IMOD current is steered through Q0 to by the open circuit. In this case, Q0 saturates and thus functions as a base-emitter diode, which is modeled in the figure by replacing Q0 with a diode D2. It can be seen that substantially the entire IMOD current flows through the collector and emitter of Q2 and the base of Q0. In normal operation, the maximum base current of Q0 in the illustrative embodiment is less than about 2 mA, and the maximum collector-to-emitter current of Q2 is about 5 mA. Therefore, in the presence of the fault condition, the Q2 collector and emitter, the Q0 base structure, and the Q2 to Q0 interconnect each carry about 12 to 30 times the corresponding current carried when Q0 is in its normal operating condition.

As indicated previously, conventional approaches have failed to provide an acceptable solution to the output stage saturation problem illustrated in FIG. 4. Adding a sufficiently large current limiting resistor in the Q0 and Q2 base circuits will unduly limit the circuit speed. In addition, limiting the base current to Q0 will cause QB to saturate in the above-described fault condition, which will overstress QA and the base of QB. A brute force approach is to size the Q2 collector and emitter, the Q0 base structure, and the Q2 to Q0 interconnect to carry the maximum IMOD current of about 60 mA. However, as noted above, the resulting increased parasitic capacitance coupled with running the oversized transistors at very low current densities in normal operation will prevent proper operation at high speeds.

It is to be appreciated that the present invention prevents the output stage saturation condition illustrated in FIG. 4 through the use of the output load detection circuit 220.

FIG. 5 shows one possible implementation of the output load detection circuit 220. The circuit 220 receives as inputs the outputs OUTP and OUTN, and generates an output indicator denoted FLAG in the presence of an output stage saturation condition. The output load detection circuit includes resistors R1P and R2P configured as a voltage divider at the OUTP terminal, resistors R1N and R2N configured as a voltage divider at the OUTN terminal, comparators A1 and A2, and a two-input NAND gate 222.

The resistors R1P and R2P are arranged in series between the OUTP terminal and the lower supply voltage VSS, with the non-inverting terminal of comparator A1 coupled to the interconnection point of resistors R1P and R2P. Similarly, the resistors R1N and R2N are arranged in series between the OUTN terminal and the lower supply voltage VSS, with the non-inverting terminal of comparator A2 coupled to the interconnection point of resistors R1N and R2N.

The resistors R1P and R2P may be set to 51 kohm and 102 kohm, respectively. Similarly, the resistors R1N and R2N may be set to 51 kohm and 102 kohm, respectively. Those skilled in the art will recognize that other resistance values can also be used.

An internal voltage reference VREF is coupled to the inverting terminals of the comparators A1 and A2 as shown. This voltage reference may be generated in a straightforward manner, as will be readily apparent to those skilled in the art.

In normal operation of the laser driver 200, the laser diode D1 and an associated load resistor will generally maintain the voltage at the OUTP and OUTN terminals at a level greater than about 1.2 volts. The output load detection circuit 220 of FIG. 5 is configured to detect if an output load is damaged, missing or otherwise at an improper value by comparing the output voltage at terminals OUTP and OULTN to the internal voltage reference VREF. More particularly, if the voltage at either the OUTP or OUTN terminal drops below a load detection sense threshold given by $$\left(1 + \frac{R1}{R2}\right) VREF,$$

it is assumed that the output load is damaged, missing or otherwise at an improper value, and the output indicator FLAG goes to a logic high level. For the above-specified threshold, R1 denotes R1P for the OUTP terminal and R1N for the OUTN terminal, and R2 denotes R2P for the OUTP terminal and R2N for the OUTN terminal. In this example, a VREF value of about 0.8 volts, with the 51 kohm and 102 kohm resistance values given previously, will set the load detection sense threshold to about 1.2 volts.

Referring again to FIG. 3 in the illustrative embodiment, the output indicator FLAG from circuit 220 is preferably supplied to a control logic circuit 225 which is associated with the laser driver 200 and is configured to shut down the IMOD current generation circuit when FLAG is at a logic high level. Upon connection of the proper load, the voltage at the OUTP and OUTN terminals will be pulled up above the load detection sense threshold As a result, the output indicator FLAG will return to a logic low level, the IMOD current generation circuit will again be enabled, and the laser driver 200 returns to a normal operating mode.

The control logic circuit 225 is illustratively shown as comprising a switch coupled between the I3 current source and the interconnection point of the QA base terminal and the QC collector terminal. When the FLAG output of the circuit 220 is at a logic high level, the switch is opened, thereby disabling the QA, QB and QC current generator which generates the IMOD current. When FLAG is at a logic low level, the switch is closed and the IMOD current is generated in the normal manner.

It is to be appreciated that the circuit 225 is shown in this simplified form for illustrative purposes only. The invention does not require the use of any particular control logic circuit for processing the output indicator FLAG from circuit 220, and those skilled in the art will be able to devise numerous circuits that can interrupt, limit or otherwise control the output stage current based on the FLAG logic level. For example, the IMOD current generation circuit could be completely disabled, or placed into a safe, low-current mode of operation.

Advantageously, by shutting down or otherwise controlling the IMOD current generation circuit in this manner, the laser driver 200 is protected from the output stage saturation problem previously described.

The comparators A1 and A2 may be configured to exhibit a relatively slow response, e.g., a response on the order of microseconds or milliseconds, since the transistors and interconnects in a given laser driver circuit of the type described above are generally sufficiently robust to handle over-current conditions of short duration. An example comparator bias current suitable for use in the illustrative embodiment may be on the order of about 50 $\mu$A, although other values can of course be used.

The particular embodiments of the invention as described herein are intended to be illustrative only. For example, as previously indicated, different device types and circuit configurations may be used in other embodiments. As another example, the single-bit FLAG output indicator in the illustrative embodiment may be replaced with a multi-bit digital indicator, or an analog indicator. In addition, the particular configuration of the output load detection circuit and the manner in which its output indicator alters the driver current can be modified. Furthermore, although illustrated using multiple differential circuits, a laser driver in accordance with the invention can also be implemented using one or more single-ended circuits. In such an embodiment, a single-ended input data signal applied to the driver circuit may be converted to a differential data signal within the driver circuit. These and numerous other alternative embodiments within the scope of the following claims will be readily apparent to those skilled in the art.

What is claimed is:

1. A driver circuit for an optical source, the driver circuit comprising:
    at least an input stage and an output stage, the output stage being operatively coupled to the input stage;
    a current generator circuit adapted to establish a modulation current for application to one of a first output and a second output of the output stage in accordance with an input data signal applied to the input stage; and
    an output load detection circuit having first and second inputs coupled to the respective first and second outputs of the output stage, the output load detection circuit being configured to detect an improper load condition at one or more of the first and second outputs of the output stage and to generate a corresponding output indicator;
    the output indicator being utilizable in the driver circuit to control the modulation current so as to prevent saturation of at least one device in the output stage in the presence of the improper load condition.

2. The driver circuit of claim 1 wherein the optical source comprises a laser diode.

3. The driver circuit of claim 1 wherein the output stage comprises a differential pair.

4. The driver circuit of claim 1 wherein the input data signal comprises a differential data signal applied to a differential pair of the input stage.

5. The driver circuit of claim 1 wherein the input data signal comprises a single-ended input data signal configured for conversion internally to the driver circuit to a differential data signal adapted to control application of the modulation current to the first and second outputs of the output stage.

6. The driver circuit of claim 1 further comprising an intermediate stage operatively coupled between the input stage and the output stage.

7. The driver circuit of claim 6 wherein the intermediate stage comprises a push-pull stage having a top portion which is driven by outputs of the input stage and drives the output stage, and a bottom portion which is driven by differential data corresponding to the input data signal.

8. The driver circuit of claim 1 wherein the first and second outputs of the driver circuit are associated with respective collector terminals of corresponding transistors of an output stage differential pair of the driver circuit.

9. The driver circuit of claim 1 wherein the output indicator comprises a single-bit output flag.

10. The driver circuit of claim 1 wherein the output load detection circuit is configured to determine if a voltage level of at least one of the first and second outputs of the output stage drops below a designated load detection sense threshold.

11. The driver circuit of claim 10 wherein the load detection sense threshold is approximately 1.2 volts.

12. The driver circuit of claim 10 wherein the load detection circuit further comprises:
    first and second voltage dividers coupled to respective first and second outputs of the output stage;
    first and second comparators each having a first input coupled to a corresponding one of the first and second voltage dividers and a second input coupled to a voltage reference; and
    an output logic gate configured to receive as inputs corresponding outputs of the first and second comparators, the output logic gate generating the output indicator.

13. The driver circuit of claim 12 wherein the designated load detection sense threshold is given by:

$$\left(1 + \frac{R1}{R2}\right) VREF,$$

where VREF is the voltage reference, and R1 and R2 are resistors of a given one of the first and second voltage dividers.

14. The driver circuit of claim 1 wherein the output indicator generated by the output load detection circuit is operative to disable the generation of the modulation current in the current generator circuit.

15. The driver circuit of claim 1 wherein the output indicator generated by the output load detection circuit is operative to control the application of the modulation current to the output stage.

16. An integrated circuit comprising:
    at least one driver circuit for an optical source, the driver circuit comprising:
    at least an input stage and an output stage, the output stage being operatively coupled to the input stage;
    a current generator circuit adapted to establish a modulation current for application to one of a first output and a second output of the output stage in accordance with an input data signal applied to the input stage; and
    an output load detection circuit having first and second inputs coupled to the respective first and second outputs of the output stage, the output load detection circuit being configured to detect an improper load condition at one or more of the first and second outputs of the output stage and to generate a corresponding output indicator,
    the output indicator being utilizable in the driver circuit to control the modulation current so as to prevent saturation of at least one device in the output stage in the presence of the improper load condition.

17. An apparatus comprising:
    an optical source; and
    a driver circuit coupled to the optical source, the driver circuit comprising:
    at least an input stage and an output stage, the output stage being operatively coupled to the input stage;
    a current generator circuit adapted to establish a modulation current for application to one of a first output and a second output of the output stage in accordance with an input data signal applied to the input stage; and
    an output load detection circuit having first and second inputs coupled to the respective first and second outputs of the output stage, the output load detection circuit being configured to detect an improper load condition at one or more of the first and second outputs of the output stage and to generate a corresponding output indicator;
    the output indicator being utilizable in the driver circuit to control the modulation current so as to prevent saturation of at least one device in the output stage in the presence of the improper load condition.

* * * * *